(12) United States Patent
Bhowmik et al.

(10) Patent No.: US 8,659,362 B2
(45) Date of Patent: Feb. 25, 2014

(54) RELAXATION OSCILLATOR CIRCUIT WITH REDUCED SENSITIVITY OF OSCILLATION FREQUENCY TO COMPARATOR DELAY VARIATION

(75) Inventors: Prasenjit Bhowmik, Tripura (IN); Rishi Mathur, Delhi (IN); Sriram Ganesan, Karnataka (IN); Sunil Rajan, Kerala (IN)

(73) Assignee: Cadence AMS Design India Private Limited, Karnataka (IN)

( * ) Notice: Subject to any disclaimer, the term of this patent is extended or adjusted under 35 U.S.C. 154(b) by 0 days.

(21) Appl. No.: 13/301,806

(22) Filed: Nov. 22, 2011

(65) Prior Publication Data
US 2012/0319789 A1    Dec. 20, 2012

(51) Int. Cl.
*H03K 3/00*    (2006.01)
(52) U.S. Cl.
USPC ............................ 331/111; 331/143; 331/113
(58) Field of Classification Search
USPC .......................................... 331/111, 113, 143
See application file for complete search history.

(56) References Cited

U.S. PATENT DOCUMENTS 8,289,091 B2 *  10/2012  Yang et al. ..................... 331/111

* cited by examiner

*Primary Examiner* — Arnold Kinkead
(74) *Attorney, Agent, or Firm* — Rosenberg, Klein & Lee (57) ABSTRACT

A relaxation oscillator circuit with reduced sensitivity of oscillation frequency to comparator delay variation includes a first current source that generates charging current, a second current source coupled to the first current source to generate reference voltage, a resistor coupled to the second current source to enable generation of the reference voltage, a capacitor coupled to the first current source that is charged based on the charging current, a comparator responsive to voltage corresponding to the capacitor and the reference voltage to generate output voltage, a peak detector coupled to the capacitor to generate peak voltage, an error detector coupled to the peak detector and the second current source to generate an error based on the peak voltage and the reference voltage, and a controller coupled to the error detector to control one of the charging current, offset voltage input to the comparator, and capacitance of the capacitor.

20 Claims, 9 Drawing Sheets

RELAXATION OSCILLATOR CIRCUIT WITH REDUCED SENSITIVITY OF OSCILLATION FREQUENCY TO COMPARATOR DELAY VARIATION

TECHNICAL FIELD

Embodiments of the disclosure relate to a relaxation oscillator circuit with reduced sensitivity of oscillation frequency to comparator delay variation.

BACKGROUND

Silicon oscillators are replacing crystal oscillators for a clock signal generator to a system-on-chip (SOC). A silicon oscillator requires less power-up time as compared to a crystal oscillator. The silicon oscillator further occupies lesser area compared to the crystal oscillator as additional timing components are not required. The silicon oscillator is usually implemented as a relaxation oscillator. The relaxation oscillator generally operates by charging and discharging a capacitor to a set of predefined reference voltages. The reference voltages are fed to a comparator as input to detect if the capacitor has been charged or discharged beyond the respective reference voltages. Output of the comparator is used to determine if the capacitor is to be charged or discharged.

However, the comparator takes a finite amount of time to generate the output, which is referred to as a comparator delay. Time taken by the capacitor to charge to the reference voltage is defined as charging time of the capacitor. Time taken by the capacitor to discharge is defined as discharging time of the capacitor. A sum of the charging time, discharging time, and the comparator delay equals an oscillation time period of the relaxation oscillator. Typically, an accurate relaxation oscillator requires that the comparator delay be reduced. High values of the comparator delay together with variation of the comparator delay due to fluctuations in temperature and supply voltage reduces accuracy of the relaxation oscillator.

In light of the foregoing discussion, there is a need for a method and system to reduce contribution of the comparator delay to the oscillation time period and thus, the oscillation frequency.

SUMMARY

An example of a relaxation oscillator circuit with reduced sensitivity of oscillation frequency to comparator delay variation includes a first current source that generates a charging current. The relaxation oscillator circuit also includes a second current source coupled to the first current source to generate a reference voltage, and a resistor coupled to the second current source to enable generation of the reference voltage. The relaxation oscillator circuit includes a capacitor, coupled to the first current source, that is charged based on the charging current. The relaxation oscillator circuit further includes a comparator that is responsive to a voltage corresponding to the capacitor and the reference voltage to generate an output voltage. Further, the relaxation oscillator circuit includes a peak detector coupled to the capacitor to generate a peak voltage. Moreover, the relaxation oscillator circuit includes an error detector coupled to the peak detector and the second current source to generate an error based on the peak voltage and the reference voltage, and a controller coupled to the error detector to control one of the charging current, an offset voltage input to the comparator, and a capacitance of the capacitor.

Another example of a relaxation oscillator circuit with reduced sensitivity of oscillation frequency to comparator delay variation includes a first current source that generates a charging current, and a second current source coupled to the first current source to generate a reference voltage. The relaxation oscillator circuit also includes a capacitor, coupled to the first current source, that is charged based on the charging current. The relaxation oscillator circuit further includes a comparator that is responsive to a voltage corresponding to the capacitor and the reference voltage to generate an output voltage, a peak detector coupled the capacitor to generate a peak voltage, and a divide by two circuit coupled to the comparator to divide an output of the comparator by two. Further, the relaxation oscillator circuit includes a switched capacitor amplifier that amplifies the reference voltage by a ratio of capacitance values to provide a voltage. Moreover, the relaxation oscillator circuit includes a switched capacitor integrator coupled to the switched capacitor amplifier to integrate an error between the peak voltage and the reference voltage, and an inverting gain circuit coupled between the capacitor and the switched capacitor integrator to modify capacitance of the capacitor.

Another example of a relaxation oscillator circuit with reduced sensitivity of oscillation frequency to comparator delay variation includes a first current source that generates a charging current, and a second current source coupled to the first current source to generate a reference voltage. The relaxation oscillator circuit also includes a capacitor, coupled to the first current source, that is charged based on the charging current. The relaxation oscillator circuit further includes a comparator that is responsive to a voltage corresponding to the capacitor and the reference voltage to generate an output voltage, a peak detector coupled the capacitor to generate a peak voltage, and a resistor coupled to the peak detector to generate a current based on the peak voltage. Further, the relaxation oscillator circuit includes an integrator, coupled to the resistor, to integrate an error between a current based on the peak voltage and the charging current of the capacitor. Moreover, the relaxation oscillator circuit includes an inverting gain circuit, coupled between the capacitor and the integrator, that modifies the charging current of the capacitor.

Another example of a relaxation oscillator circuit with reduced sensitivity of oscillation frequency to comparator delay variation includes a first current source that generates a charging current, and a second current source coupled to the first current source to generate a reference voltage. The relaxation oscillator circuit also includes a resistor coupled to the second current source to enable generation of the reference voltage. The relaxation oscillator circuit further includes a capacitor, coupled to the first current source, that is charged based on the charging current. Further, the relaxation oscillator circuit includes a comparator that is responsive to a voltage corresponding to the capacitor and the reference voltage to generate an output voltage, and a peak detector coupled the capacitor to generate a peak voltage. Moreover, the relaxation oscillator circuit includes an integrator, coupled between the peak detector and the second current source, to control the second current source by integrating an error between the peak voltage and the reference voltage.

An example of a method for reducing effect of comparator delay on oscillation frequency in a relaxation oscillator circuit includes generating a reference voltage. The method also includes comparing the reference voltage with a voltage corresponding to a capacitor to control charging and discharging of the capacitor. The method further includes generating a peak voltage of the capacitor. Further, the method includes generating a control signal based on an error between the peak voltage and the reference voltage. Moreover, the method includes adjusting one of current, capacitance, and voltage based on the control signal.

BRIEF DESCRIPTION OF THE VIEWS OF DRAWINGS

In the accompanying figures, similar reference numerals may refer to identical or functionally similar elements. These reference numerals are used in the detailed description to illustrate various embodiments and to explain various aspects and advantages of the disclosure.

DETAILED DESCRIPTION OF THE EMBODIMENTS

Figure 1:
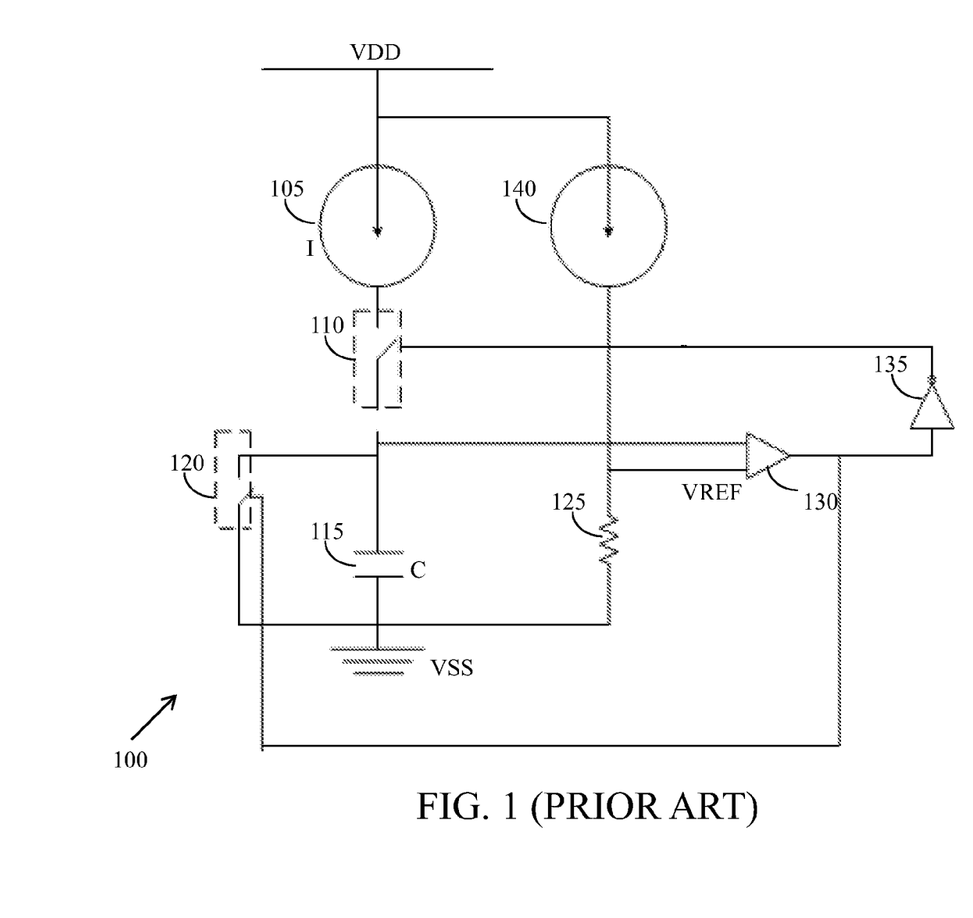
FIG. 1 is an exemplary illustration of a relaxation oscillator, in accordance with prior art.

FIG. 1 is an exemplary illustration of a relaxation oscillator 100, in accordance with prior art.

The relaxation oscillator 100 includes a current source 105, a switch 110, a capacitor 115, a switch 120, a resistor 125, a comparator 130, a logic gate 135, and a current source 140.

The current source 105 is coupled between the power supply (VDD) and the first terminal of the switch 110. The capacitor 115 is coupled between the second terminal of the switch 110 and the ground supply (VSS). The capacitor 115 is also coupled across the switch 120. The comparator 130 has the positive input coupled between the second terminal of the switch 110 and the capacitor 115, and the negative input coupled to the first terminal of the resistor 125. The second terminal of the resistor 125 is coupled between the capacitor 115 and VSS. The logic gate 135, for example a NOT gate, is coupled between the output of the comparator 130 and the first terminal of the switch 110. The output of the comparator 130 is also coupled to the switch 120. The current source 140 is coupled to the negative input of the comparator 130.

A current (I) is generated using the current source 105. The current from the current source 105 is optionally provided to the capacitor 115 using the switch 110. Voltage at the capacitor 115 is compared with a reference voltage (VREF) that is further set using the resistor 125. VREF is a voltage to which the capacitor 115 has to be charged. The comparator 130 compares the voltage with VREF and provides an output to the logic gate 135 and to the switch 120. The logic gate 135 inverts the output of the comparator 130.

The output of the comparator 130 is used to stop charging or discharging of the capacitor 115. If the voltage across the capacitor 115 is less than VREF, the capacitor 115 has to be charged to VREF else the capacitor 115 has to be discharged. The comparator 130 takes finite time to perform comparison of inputs. The finite time taken by the comparator 130 is referred to as comparator delay. Oscillation time period (T) is calculated using sum of charge up time of the capacitor 115 to VREF and the comparator delay. If the comparator delay is lesser than the oscillation time period, then oscillation frequency primarily depends on resistance and capacitance values of the resistor 125 and the capacitor 115 respectively. The comparator delay also contributes in deciding the oscillation frequency and any variation in the comparator delay with VDD and temperature reduces accuracy of the relaxation oscillator 100. However, the oscillation frequency of the relaxation oscillator 100 has to be independent of temperature and supply voltage as the comparator delay varies drastically with the supply voltage and the temperature. Hence, it is required to make the oscillation frequency a function of the resistance and the capacitance values, and independent of the comparator delay.

Figure 2:
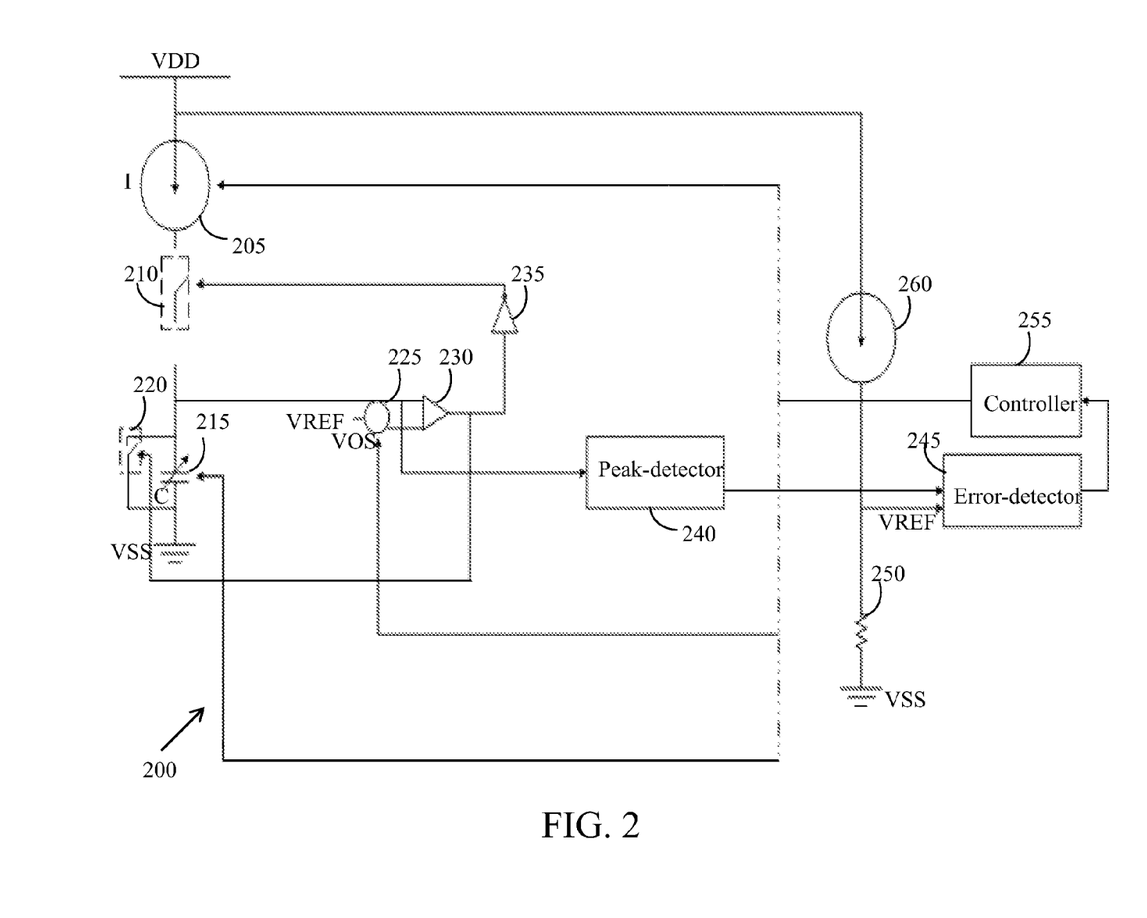
FIG. 2 is an exemplary illustration of a relaxation oscillator, in accordance with one embodiment.

FIG. 2 is a block diagram of a relaxation oscillator 200, in accordance with one embodiment.

The relaxation oscillator 200 includes a current source 205, a switch 210, a capacitor 215, a switch 220, an offset voltage source 225, a comparator 230, a logic gate 235, a peak detector 240, an error detector 245, a resistor 250, a controller 255, and a current source 260.

The current source 205 is coupled between a power supply (VDD) and a first terminal of the switch 210. The capacitor 215 is coupled between a second terminal of the switch 210 and a ground supply (VSS). The capacitor 215 is also coupled across the switch 220. The comparator 230 has a positive input coupled between the second terminal of the switch 210 and the capacitor 215, and a negative input coupled to the offset voltage source (VOS) 225. The logic gate 235, for example a NOT gate, is coupled between output of the comparator 230 and the first terminal of the switch 210. The output of the comparator 230 is also coupled to the switch 220. The peak detector 240 is coupled between the positive input of the comparator 230 and input of the error detector 245. The resistor 250 is coupled between the input of the error detector 245 and VSS. The controller 255 is coupled between the error detector 245 and the current source 205. The controller 255 is also coupled to the offset voltage source 225 and the capacitor 215.

A current (I), a charging current, is generated using the current source 205. The current from the current source 205 is optionally provided to the capacitor 215 to charge the capacitor 215 using the switch 210. Voltage at the capacitor 215 is compared with a reference voltage (VREF) that is predefined and can further be adjusted using the offset voltage source 225. VREF is a voltage to which the capacitor 215 has to be charged and is generated using the current source 260 and the resistor 250. The comparator 230 compares the voltage with VREF that is adjusted, and provides an output to the logic gate 235 and to the switch 220. The switch 220 controls discharge of the capacitor 215 based on the output of the comparator 230. The output of the comparator 230 is inverted by the logic gate 235 and further provided to the switch 210. The voltage at the capacitor 215 is provided to the peak detector 240. The peak detector 240 measures a peak swing at the capacitor 215. The peak detector 240 can be a circuit including a diode and capacitor. The peak detector 240 can also be a circuit including two capacitors that are used in core of the relaxation oscillator 200 and which can be removed alternatively. The peak swing stored in the capacitor that is removed can be used to detect peak of oscillation. The peak detector 240 hence provides a peak voltage (VPEAK) to the error detector 245. The error detector 245 generates an error based on VPEAK and VREF. The controller 255, based on output of the error detector 245, adjusts one of the current (I) that charges the capacitor 215, capacitance of the capacitor 215, or trip point of the comparator 230 by adjusting the offset voltage source 225 in an adjustment loop. For adjusting the current I, the capacitance of the capacitor 215, or voltage in the offset voltage source 225, the controller 255 has a predefined transfer function and based on output voltage of the error detector 245, other values of the current, the capacitance, or the voltage are applied. In some embodiments, the adjustment loop is a closed loop correction system using a negative feedback loop.

Figure 3:
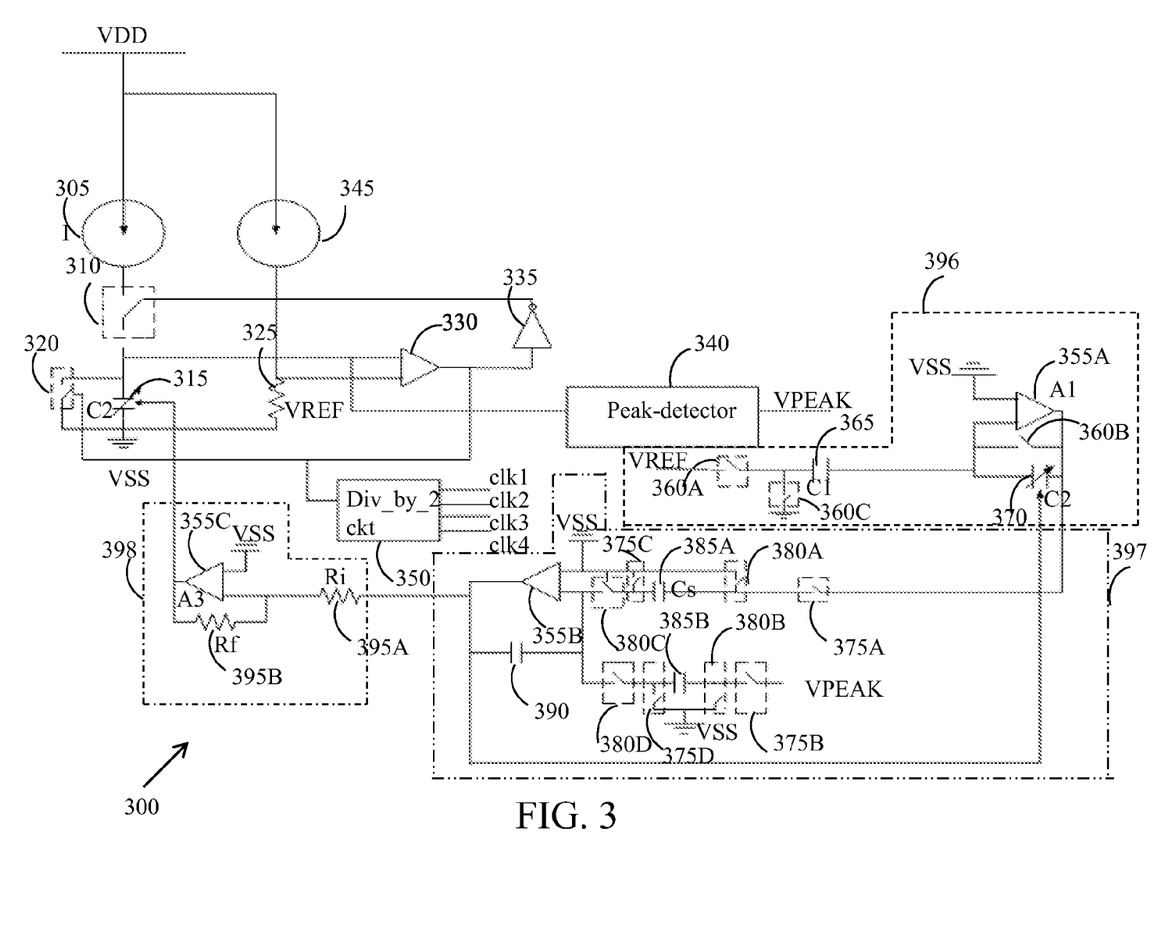
FIG. 3 is an exemplary illustration of a relaxation oscillator with an analog control loop, in accordance with one embodiment.

FIG. 3 is a block diagram of a relaxation oscillator 300 with an analog control loop, in accordance with one embodiment.

The relaxation oscillator 300 includes a current source 305, a switch 310, a capacitor 315, a switch 320, a resistor 325, a comparator 330, a logic gate 335, a peak detector 340, a current source 345, a divide by two circuit 350, an amplifier 355A, an amplifier 355B, an amplifier 355C, a switch 360A, a switch 360B, a switch 360C, a capacitor 365, a capacitor 370, a switch 375A, a switch 375B, a switch 375C, a switch 375D, a switch 380A, a switch 380B, a switch 380C, a switch 380D, a capacitor 385A, a capacitor 385B, a capacitor 390, a resistor 395A, and a resistor 395B. The divide by two circuit 350 also includes a non-overlap clock generator.

The amplifier 355A, the switch 360A, the switch 360B, the switch 360C, the capacitor (C1) 365, and the capacitor (C2) 370 together represent a switched capacitor amplifier 396. The switch 375A, the switch 375B, the switch 375C, the switch 375D, the switch 380A, the switch 380B, the switch 380C, the switch 380D, the capacitor 385A, the capacitor 385B, the capacitor 390, and the amplifier 355B together represent a switched capacitor integrator 397. The amplifier 355C, the resistor 395A, and the resistor 395B together represent an inverting gain circuit 398.

The current source 305 is coupled between a power supply (VDD) and a first terminal of the switch 310. The capacitor 315 is coupled between a second terminal of the switch 310 and a ground supply (VSS). The capacitor 315 is also coupled across the switch 320. The comparator 330 has a positive input coupled between the second terminal of the switch 310 and the capacitor 315, and a negative input coupled to a first terminal of the resistor 325. A second terminal of the resistor 325 is coupled between the capacitor 315 and VSS. The logic gate 335, for example a NOT gate, is coupled between output of the comparator 330 and the first terminal of the switch 310. The output of the comparator 330 is also coupled to the switch 320. The peak detector 340 is coupled to the positive input of the comparator 330. The current source 345 is coupled to the negative input of the comparator 330. The divide by two circuit 350 is coupled to the output of the comparator 330 and the switch 320. The amplifier 355A has a positive input coupled to VSS and a negative input coupled to first terminals of the switch 360B and the capacitor 370. The negative input of the amplifier 355A is also coupled to the capacitor 365. The switch 360A is coupled to the switch 360C and the capacitor 365. Output of the amplifier 355A and second terminals of the switch 360B and the capacitor 370 are coupled to the switch 375A. The switch 380A is coupled to VSS and between the capacitor 385A and the switch 375A. The switch 375C is coupled to VSS and between the capacitor 385A and the switch 380C. The switch 380B is coupled to VSS and between the capacitor 385B and the switch 375B. The switch 375D is coupled to VSS and between the capacitor 385B and the switch 380D. The amplifier 355B has a positive input coupled to VSS and a negative input coupled to the switch 380C, the switch 380D, and a first terminal of the capacitor 390. Output of the amplifier 355B is coupled to a second terminal of the capacitor 390, the capacitor 370, and a first terminal of the resistor 395A. The amplifier 355C has a positive input coupled to VSS and a negative input coupled to a second terminal of the resistor 395A and a first terminal of the resistor 395B. Output of the amplifier 355C is coupled to a second terminal of the resistor 395B and the capacitor 315.

A current (I), a charging current, is generated using the current source 305. The current from the current source 305 is optionally provided to the capacitor 315 to charge the capacitor 315 using the switch 310. Voltage at the capacitor 315 is compared with a reference voltage (VREF) that is predefined and can further be adjusted using the resistor 325. VREF is a voltage to which the capacitor 315 has to be charged and is generated using the current source 345 and the resistor 325. The comparator 330 compares the voltage with VREF that is adjusted, and provides an output to the logic gate 335 and to the switch 320. The switch 320 controls discharge of the capacitor 315 based on the output of the comparator 330. The output of the comparator 330 is inverted by the logic gate 335 and further provided to the switch 310. The voltage at the capacitor 315 is provided to the peak detector 340. The peak detector 340 measures a peak swing at the capacitor 315. The peak detector 340 can be a circuit including a diode and capacitor. The peak detector 340 can also be a circuit including two capacitors that are used in core of the relaxation oscillator 300 and which can be removed alternatively. The peak swing stored in the capacitor that is removed can be used to detect peak of oscillation. The peak detector 340 hence provides a peak voltage (VPEAK). VPEAK also refers to peak of oscillation. The switched capacitor amplifier 396 amplifies VREF by a ratio of capacitance values to provide an output equal to (−VREF*C1/C2). The switched capacitor amplifier 396 works with 0 input common mode and 0 output common mode. Output frequency of the core of the relaxation oscillator 300 is frequency at the output of the comparator 330 which is divided by two using the divide by two circuit 350. The non-overlap clock generator in the divide by two circuit 350 generates four non-overlapping phases to control the switch 360A, the switch 360B, and the switch 360C. The output is valid when the switch 360A is closed, and the switch 360B and the switch 360C are open. Output voltage of the switched capacitor amplifier 396 is passed through the switched capacitor integrator 397. The switched capacitor integrator 397 integrates an error between VPEAK and VREF when the switch 360A is closed, and the switch 360B and the switch 360C are open. Output of the switched capacitor integrator 397 is then passed through the inverting gain circuit 398 that modifies capacitance of the capacitor 315. Output of the inverting gain circuit 398 modifies total capacitance C2 of the capacitor 315. The switched capacitor amplifier 396, the switched capacitor integrator 397, and the inverting gain circuit 398 together represent the analog control loop. Hence, for the analog control loop, the voltage can modify a voltage controlled capacitor, for example the capacitor 315, or a varactor to modify the total capacitance.

In some embodiments, VPEAK is sampled at a predefined interval. The total capacitance is changed based on a difference of sampled peak voltage and a predefined voltage. The predefined voltage is set to be equal to VREF which is reference to the comparator. C1 is defined as the total capacitance for a given frequency, I1 and I2 are equal charging currents for the given frequency, V1 is defined as first oscillator peak voltage for the given frequency which is VREF, C2 is defined as capacitance for the given frequency due to change in comparator delay, V2 is defined as second oscillator peak voltage for the given frequency which is VREF+ $V_{OS,\ second}$.

$$C1 * \frac{V1}{I1} = C2 * \frac{V2}{I1} \quad (1)$$

$$C2 = C1 * \frac{V1}{V2} \quad (2)$$

Hence, substituting values of V1 and V2 in equation 3, $$C2 = C1 * \frac{(VREF)}{(VREF + V_{OS,second})} \quad (3)$$

Rate at which VPEAK is sampled depends on rate of change of variables that affect the comparator delay. In most cases, the rate of change of variables are changes in temperature and supply voltage that are slow thereby leading to a large sampling interval. VPEAK is then determined as, $$VPEAK = VREF + V_{OS,second} = C1 * \frac{(VREF)}{C2} \quad (4)$$

The relaxation oscillator 300 can also be implemented as a closed loop system. The capacitance of the capacitor 315 is changed and VPEAK is compared to C1*VREF/C2. At equilibrium, VPEAK and C1*VREF/C2 are determined to be equal.

Figure 4:
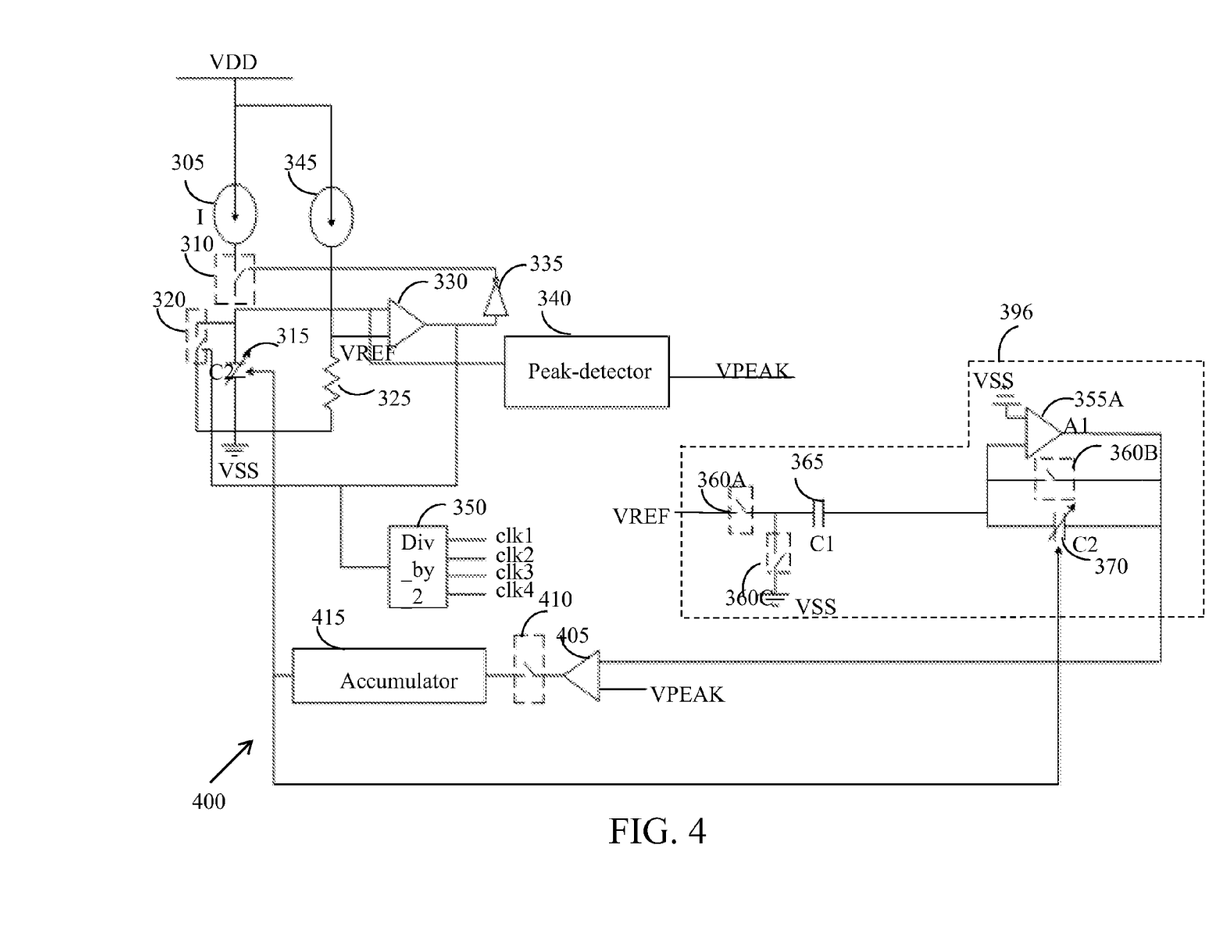
FIG. 4 is an exemplary illustration of a relaxation oscillator with a digital control loop, in accordance with one embodiment.

FIG. 4 is a block diagram of a relaxation oscillator 400 with a digital control loop, in accordance with one embodiment.

The relaxation oscillator 400 includes the current source 305, the switch 310, the capacitor 315, the switch 320, the resistor 325, the comparator 330, the logic gate 335, the peak detector 340, the current source 345, the divide by two circuit 350, the amplifier 355A, the switch 360A, the switch 360B, the switch 360C, a capacitor 365, a capacitor 370, a comparator circuit 405, a switch 410, and an accumulator 415.

For the digital control loop, the comparator circuit 405 and the accumulator 415 replaces the switched capacitor integrator 397 and the inverting gain circuit 398 respectively.

The current source 305 is coupled between the power supply (VDD) and the first terminal of the switch 310. The capacitor 315 is coupled between the second terminal of the switch 310 and the ground supply (VSS). The capacitor 315 is also coupled across the switch 320. The comparator 330 has the positive input coupled between the second terminal of the switch 310 and the capacitor 315, and the negative input coupled to the first terminal of the resistor 325. The second terminal of the resistor 325 is coupled between the capacitor 315 and VSS. The logic gate 335, for example a NOT gate, is coupled between the output of the comparator 330 and the first terminal of the switch 310. The output of the comparator 330 is also coupled to the switch 320. The peak detector 340 is coupled to the positive input of the comparator 330. The current source 345 is coupled to the negative input of the comparator 330. The divide by two circuit 350 is coupled to the output of the comparator 330 and the switch 320. The amplifier 355A has the positive input coupled to VSS and the negative input coupled to first terminals of the switch 360B and the capacitor 370. The negative input of the amplifier 355A is also coupled to the capacitor 365. The switch 360A is coupled to the switch 360C and the capacitor 365. Output of the amplifier 355A and second terminals of the switch 360B and the capacitor 370 are coupled to a positive terminal of the comparator circuit 405. The switch 410 is coupled between output of the comparator circuit 405 and a first terminal of the accumulator 415. A second terminal of the accumulator 415 is coupled to the capacitor 315 and the capacitor 370.

Voltage at the capacitor 315 is provided to the peak detector 340. The peak detector 340 generates VPEAK that is the peak of oscillation. The switched capacitor amplifier 396 amplifies VREF by a ratio of capacitance values to provide an output equal to (−VREF*C1/C2). Output frequency of the core of the relaxation oscillator 400 is frequency at the output of the comparator 330 which is divided by two using the divide by two circuit 350. The non-overlap clock generator in the divide by two circuit 350 generates four non-overlapping phases to control the switch 360A, the switch 360B, and the switch 360C. The output is valid when the switch 360A is closed, and the switch 360B and the switch 360C are open. The output voltage of the switched capacitor amplifier 396 is provided to the positive input of the comparator circuit 405. The comparator circuit 405 compares the output voltage of the switched capacitor amplifier 396 with VPEAK that is provided to the negative input of the comparator circuit 405. Output of the comparator circuit 405 is then provided to the accumulator 415 via the switch 410. The accumulator 415 samples the output of the comparator circuit 405 when the switched capacitor amplifier 396 is not reset. Based on the output of the comparator circuit 405, the accumulator 415 is increased or decreased. If the output of the switched capacitor amplifier 396 is higher than zero, the accumulator 415 is increased else is decreased. Output of the accumulator 415 is provided to the capacitor 315 and the capacitor 370. The total capacitance can hence be digitally programmed based on the output of the accumulator 415. The total capacitance is decreased if the output of the accumulator 415 increases.

Figure 5:
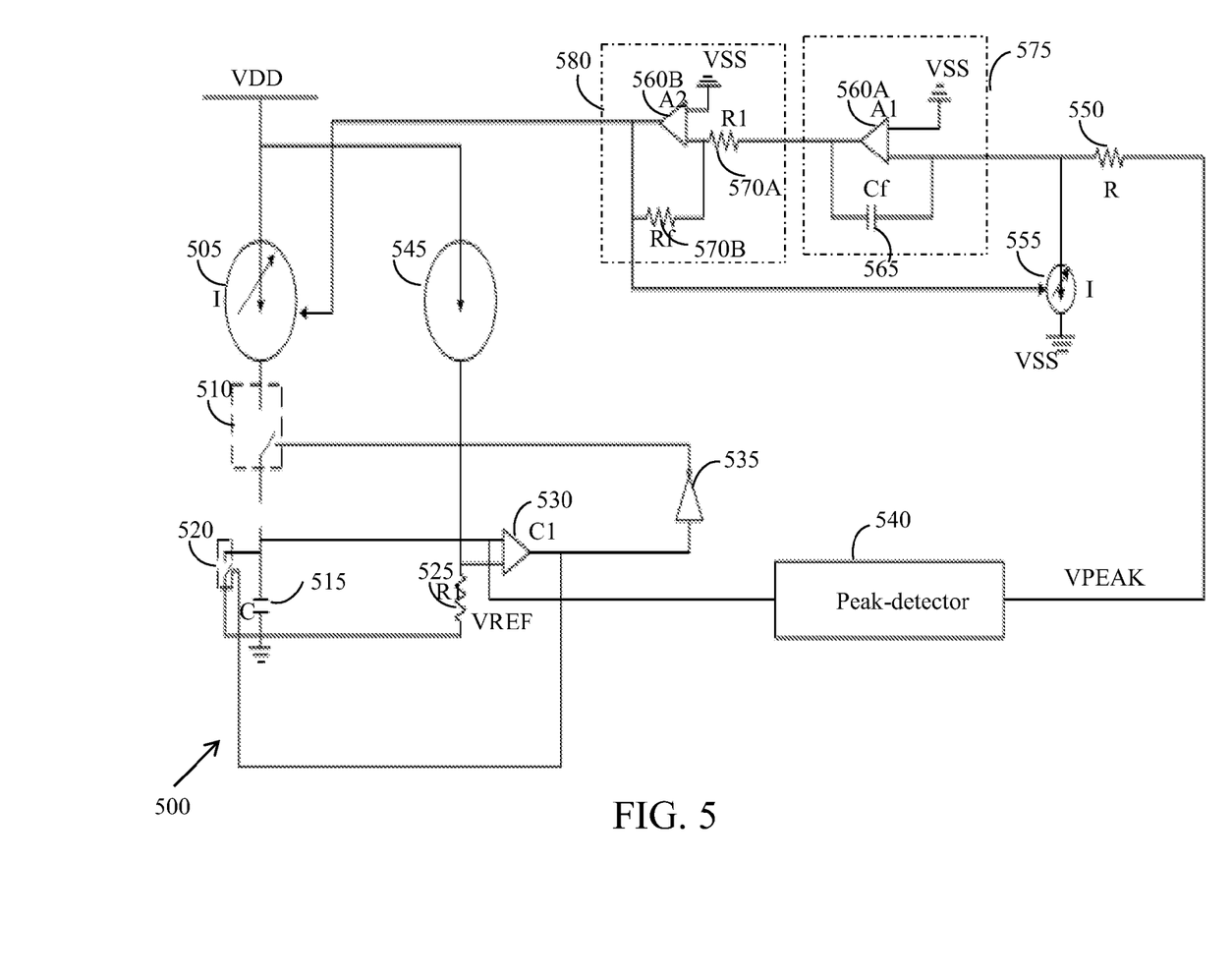
FIG. 5 is a block diagram of a relaxation oscillator with an analog control loop, in accordance with one embodiment.

FIG. 5 is a block diagram of a relaxation oscillator 500, in accordance with another embodiment.

The relaxation oscillator 500 includes a current source 505, a switch 510, a capacitor 515, a switch 520, a resistor 525, a comparator 530, a logic gate 535, a peak detector 540, a current source 545, a resistor (R) 550, a current source 555, an amplifier 560A, an amplifier 560B, a capacitor 565, a resistor 570A, and a resistor 570B.

The amplifier 560A and the capacitor 565 together represent an integrator 575. The amplifier 560B, the resistor (Ri) 570A, and the resistor (Rf) 570B together represent an inverting gain circuit 580.

The current source 505, for example a variable current source, is coupled between a power supply (VDD) and a first terminal of the switch 510. The capacitor 515 is coupled between a second terminal of the switch 510 and a ground supply (VSS). The capacitor 515 is also coupled across the switch 520. The comparator 530 has a positive input coupled between the second terminal of the switch 510 and the capacitor 515, and a negative input coupled to a first terminal of the resistor 525. A second terminal of the resistor 525 is coupled to the capacitor 515. The logic gate 535, for example a NOT gate, is coupled between output of the comparator 530 and the first terminal of the switch 510. The output of the comparator 530 is also coupled to the switch 520. The peak detector 540 is coupled to the positive input of the comparator 530. The current source 545 is coupled to the negative input of the comparator 530. A resistor 550 is coupled between the peak detector 540 and a negative input of the amplifier 560A. The current source 555 is coupled between the negative input of the amplifier 560A and the resistor 550. A positive input of the amplifier 560A is coupled to VSS. The capacitor 565 is coupled across the negative input of the amplifier 560A and output of the amplifier 560A. The resistor 570A is coupled between negative input of the amplifier 560B and the output of the amplifier 560A. A positive input of the amplifier 560B is coupled to VSS. The resistor 570B is coupled across the negative input of the amplifier 560B and output of the amplifier 560B. The output of the amplifier 560B is further coupled to the current source 555 and to the current source 505.

A current (I) is generated using the current source 505 that is a variable current source. The current I is a charging current for charging the capacitor (C) 515 in core of the relaxation oscillator 500. The current I can be programmed by changing a controlling voltage. The current from the current source 505 is optionally provided to the capacitor 515 to charge the capacitor 515 using the switch 510. Voltage at the capacitor 515 is compared with a reference voltage (VREF) that is predefined and can further be adjusted using the resistor 525. VREF is a voltage to which the capacitor 515 has to be charged and is generated using the current source 545 and the resistor 525. The comparator 530 compares the voltage with VREF that is adjusted, and provides an output to the logic gate 535 and to the switch 520. The switch 520 controls discharge of the capacitor 515 based on the output of the comparator 530. The output of the comparator 530 is inverted by the logic gate 535 and further provided to the switch 510. The voltage at the capacitor 515 is provided to the peak detector 540. The peak detector 540 provides a peak voltage (VPEAK). VPEAK is sampled by the peak detector 540 and a current equal to VPEAK/R is generated when VPEAK is passed through the resistor (R). The current is further compared with the charging current (I) that is generated by the current source 505. Error in current is integrated by the integrator 575 and output of the integrator 575 is provided to the inverting gain circuit 580. The inverting gain circuit 580 is added to have an effective negative feedback and to modify the charging current of the capacitor 515, from the current source 505. The ratio of Rf and Ri can be adjusted to control loop gain. The control loop obtains a steady state when the current equivalent to VPEAK/R equals the charging current (I) of the capacitor 515. At equilibrium, the charging current (I) of the capacitor 515 becomes equal to VPEAK/R. A different operating point is determined whenever the comparator delay changes. The charging current thereby generates an oscillation frequency which is independent of the comparator delay In some embodiments, VPEAK is sampled at a predefined interval. The charging current (I) of the capacitor 515 is changed based on a difference of sampled peak voltage and a predefined voltage. The predefined voltage is set to be equal to VREF which is reference to the comparator 530. C1 and C2 are defined as the total capacitance for a given frequency due to change in the comparator delay, I1 is charging current for the given frequency, V1 is defined as first oscillator peak voltage for the given frequency which is VREF, C2 is defined as capacitance for the given frequency due to change in comparator delay, I2 is changed charging current for the given frequency, V2 is defined as second oscillator peak voltage for the given frequency which is VREF+ $V_{OS, second}$.

$$C1 * \frac{V1}{I1} = C1 * \frac{V2}{I2} \quad (5)$$

Hence, substituting values of V1 and V2 in equation 6, $$I2 = I1 * \frac{V2}{V1} = I1 * \frac{(VREF + V_{OS,second})}{(VREF)} \quad (6)$$

Rate at which VPEAK is sampled depends on rate of change of variables that affect the comparator delay. Assuming VREF/I1=R, I2 is then determined as, $$I2 = \frac{(VREF + V_{OS,second})}{R} = \frac{VPEAK}{R} \quad (7)$$

Equation 7 illustrates that the charging current (I) has to be equal to VPEAK/R in order to have the oscillation frequency independent of the comparator delay. The relaxation oscillator 500 can be implemented as a closed loop system.

Figure 6:
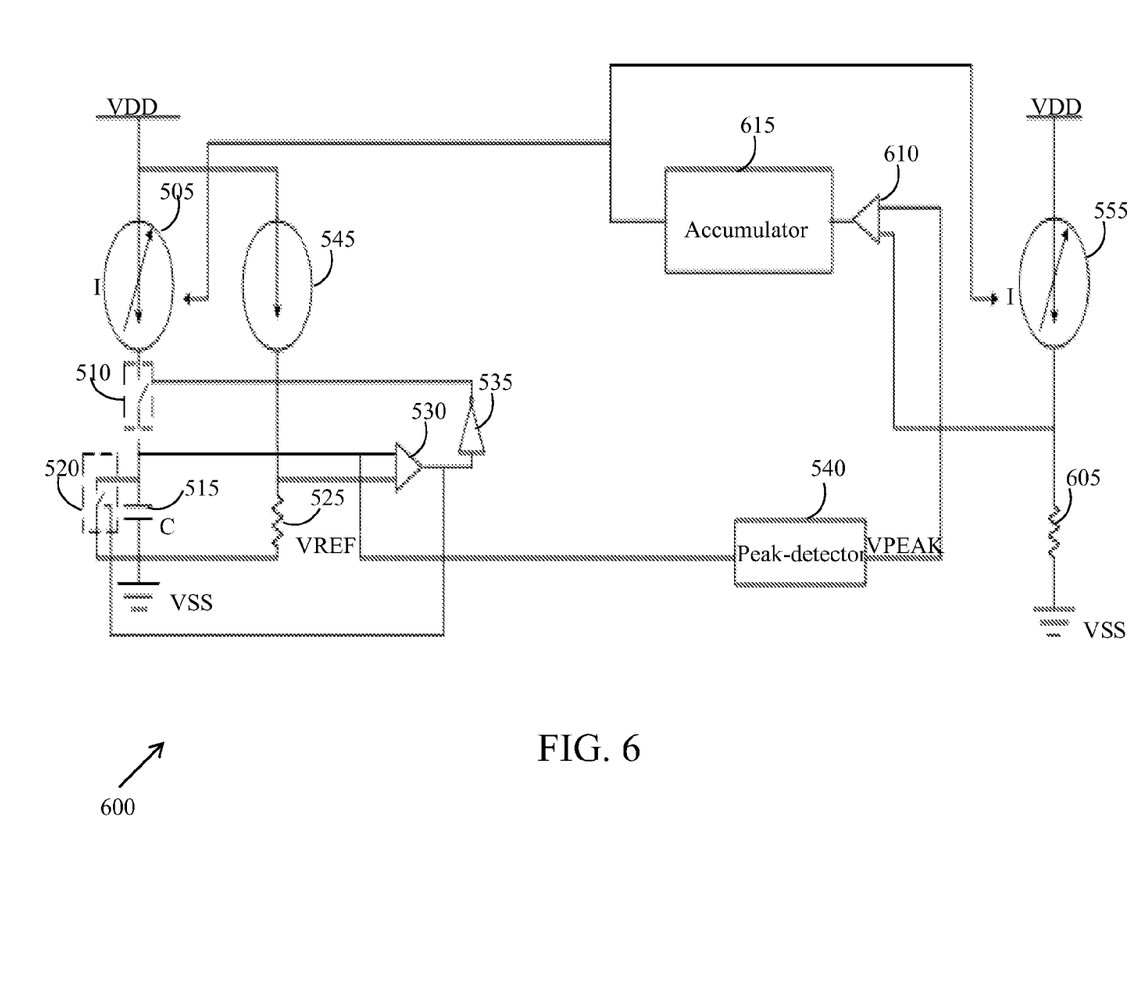
FIG. 6 is a block diagram of a relaxation oscillator with a digital control loop, in accordance with one embodiment.

FIG. 6 is a block diagram of a relaxation oscillator 600, in accordance with another embodiment.

The relaxation oscillator 600 includes the current source 505, the switch 510, the capacitor 515, the switch 520, the resistor 525, the comparator 530, the logic gate 535, the peak detector 540, the current source 545, the current source 555, a resistor 605, a comparator circuit 610, and an accumulator 615.

For the digital control loop, the comparator circuit 610 replaces the integrator 575, and the accumulator 615 replaces the inverting gain circuit 580.

The current source 505, for example a variable current source, is coupled between the power supply (VDD) and the first terminal of the switch 510. The capacitor 515 is coupled between the second terminal of the switch 510 and the ground supply (VSS). The capacitor 515 is also coupled across the switch 520. The comparator 530 has the positive input coupled between the second terminal of the switch 510 and the capacitor 515, and the negative input coupled to the first terminal of the resistor 525. The second terminal of the resistor 525 is coupled to the capacitor 515. The logic gate 535, for example a NOT gate, is coupled between the output of the comparator 530 and the first terminal of the switch 510. The output of the comparator 530 is also coupled to the switch 520. The peak detector 540 is coupled to the positive input of the comparator 530. The current source 545 is coupled to the negative input of the comparator 530. The current source 555 is coupled between VDD and the resistor 605. The peak detector 540 is coupled to the positive input of the comparator circuit 610. A negative input of the comparator circuit 610 is coupled between the current source 555 and the resistor 605. Output of the comparator circuit 610 is coupled to a first terminal of the accumulator 615. A second terminal of the accumulator 615 is coupled to the current source 505 and to the current source 555.

Voltage at the capacitor 515 is provided to the peak detector 540. The peak detector 540 generates VPEAK that is the peak of oscillation. VPEAK is sampled by the peak detector 540 and is provided to the positive input of the comparator circuit 610. A voltage equal to the charging current (I) from the current source 555 multiplied by resistance (R) of the resistor 605, is generated and compared with VPEAK by the comparator circuit 610. The output of the comparator circuit 610 drives the accumulator 615. If the output of the comparator circuit 610 is high, the accumulator 615 is increased and if the output of the comparator circuit 610 is low, the accumulator 615 is decreased. The output of the accumulator 615 changes the charging current (I) of the capacitor 515 through the current source 505 which is a current digital-to-analog converter (DAC).

In some embodiments, VPEAK is sampled at a predefined interval. A peak voltage to which the capacitor 515 charges is kept constant. The peak voltage is given by sum of VREF and offset voltage (VOS) that changes with the comparator delay. The peak voltage can be kept constant across different comparator delays by adjusting VREF provided to the comparator 530 such that the sum of different VREF and the offset voltage remains constant. Difference of VPEAK and VREF is calculated and a comparator reference voltage (VCOMP) is adjusted such that VCOMP+VOS=VREF for each value of VOS. Rate at which VPEAK is sampled depends on rate of change of variables that affect the comparator delay.

Figure 7:
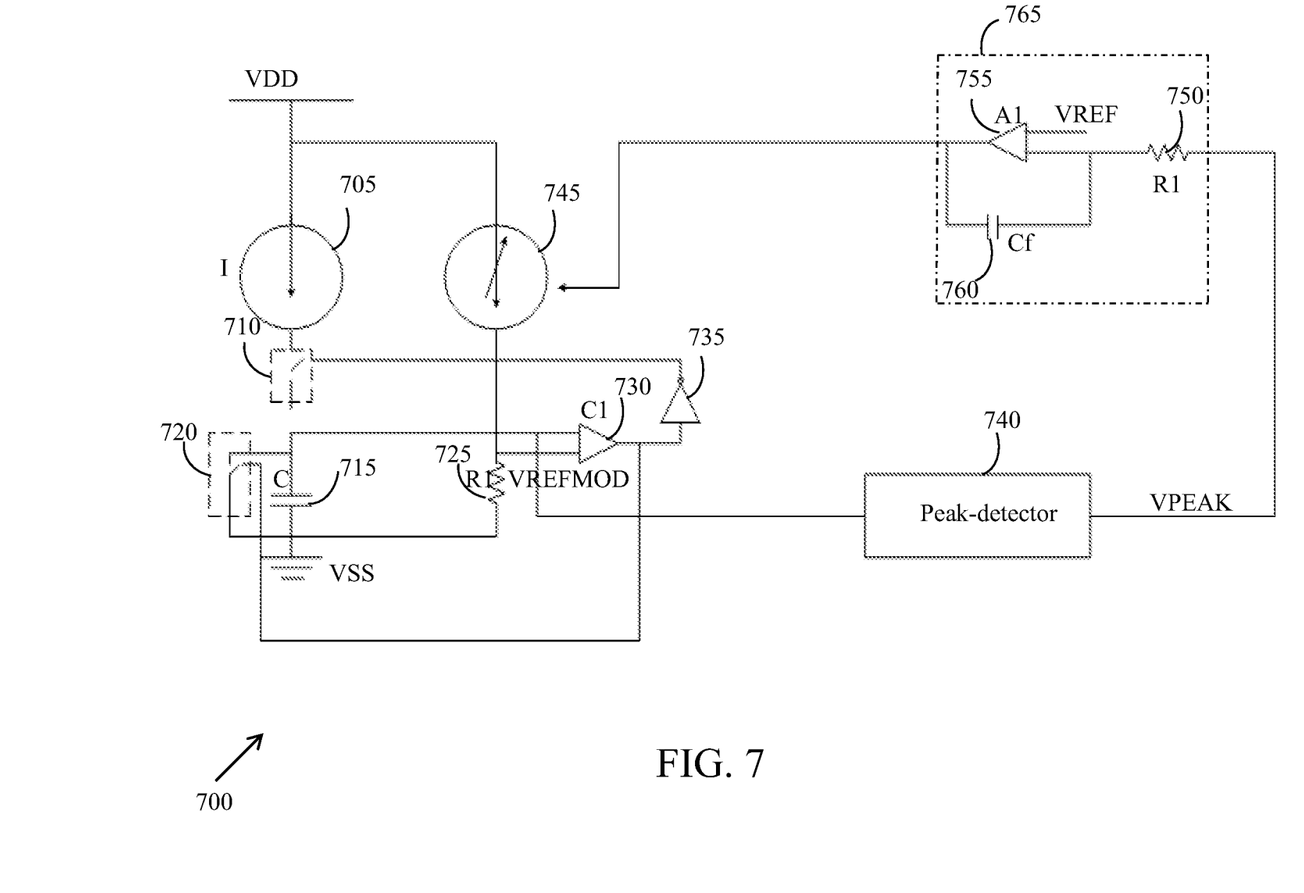
FIG. 7 is a block diagram of a relaxation oscillator with an analog control loop, in accordance with another embodiment.

FIG. 7 is a block diagram of a relaxation oscillator 700, in accordance with another embodiment.

The relaxation oscillator 700 includes a current source 705, a switch 710, a capacitor 715, a switch 720, a resistor 725, a comparator 730, a logic gate 735, a peak detector 740, a current source 745, a resistor 750, an amplifier 755, and a capacitor 760.

The resistor 750, the amplifier 755, and the capacitor 760 together represent an integrator 765.

The current source 705 is coupled between a power supply (VDD) and a first terminal of the switch 710. The capacitor 715 is coupled between a second terminal of the switch 710 and a ground supply (VSS). The capacitor 715 is also coupled across the switch 720. The comparator 730 has a positive input coupled between the second terminal of the switch 710 and the capacitor 715, and a negative input coupled to a first terminal of the resistor 725. A second terminal of the resistor 725 is coupled to the capacitor 715. The logic gate 735, for example a NOT gate, is coupled between output of the comparator 730 and the first terminal of the switch 710. The output of the comparator 730 is also coupled to the switch 720. A first terminal of the peak detector 740 is coupled to the positive input of the comparator 730. The current source 745 is coupled to the negative input of the comparator 730. The resistor 750 is coupled between a second terminal of the peak detector 740 and a negative input of the amplifier 755. The capacitor 760 is coupled across the negative input of the amplifier 755 and output of the amplifier 755. The output of the amplifier 755 is further coupled to the current source 745.

A current (I) is generated using the current source 705. The current I is a charging current for charging the capacitor (C) 715 in core of the relaxation oscillator 700. The current source 745 is a variable current source that can be programmed by changing a controlling voltage. The current from the current source 705 is optionally provided to the capacitor 715 to charge the capacitor 715 using the switch 710. Voltage at the capacitor 715 is compared with a reference voltage (VREFMOD) that is generated by the current source 745 and can further be adjusted using the resistor 725 in a feedback loop. The comparator 730 compares the voltage with VREFMOD that is adjusted, and provides an output to the logic gate 735 and to the switch 720. The switch 720 controls discharge of the capacitor 715 based on the output of the comparator 730. The output of the comparator 730 is inverted by the logic gate 735 and further provided to the switch 710. The voltage at the capacitor 715 is provided to the peak detector 740. The peak detector 740 provides a peak voltage (VPEAK).

Hence, oscillation time period does not depend on the comparator delay, and oscillation frequency becomes a function of only the resistance and the capacitance, and thereby remains constant even with varying supply voltage and temperature. To ensure high accuracy of the voltage to which the capacitor 715 charges, it is possible to correct VREFMOD of the comparator 730 such that irrespective of the comparator delay, the capacitor 715 still charges to VREF. The correction is performed using a feedback loop which samples the VPEAK and compares it with VREF. An error between VPEAK and VREF, is integrated by the integrator 765. Output of the integrator 765 controls the current source 745 that generates VREFMOD to the comparator 730. The feedback loop minimizes the error signal which ensures that the capacitor 715 charges to VREF, irrespective of the comparator delay. In other words, the feedback loop decreases sensitivity of VPEAK to the comparator delay. If the comparator delay increases, the feedback loop decreases VREFMOD to the comparator 730 to ensure that the peak voltage of the capacitor 715 does not change.

Figure 8:
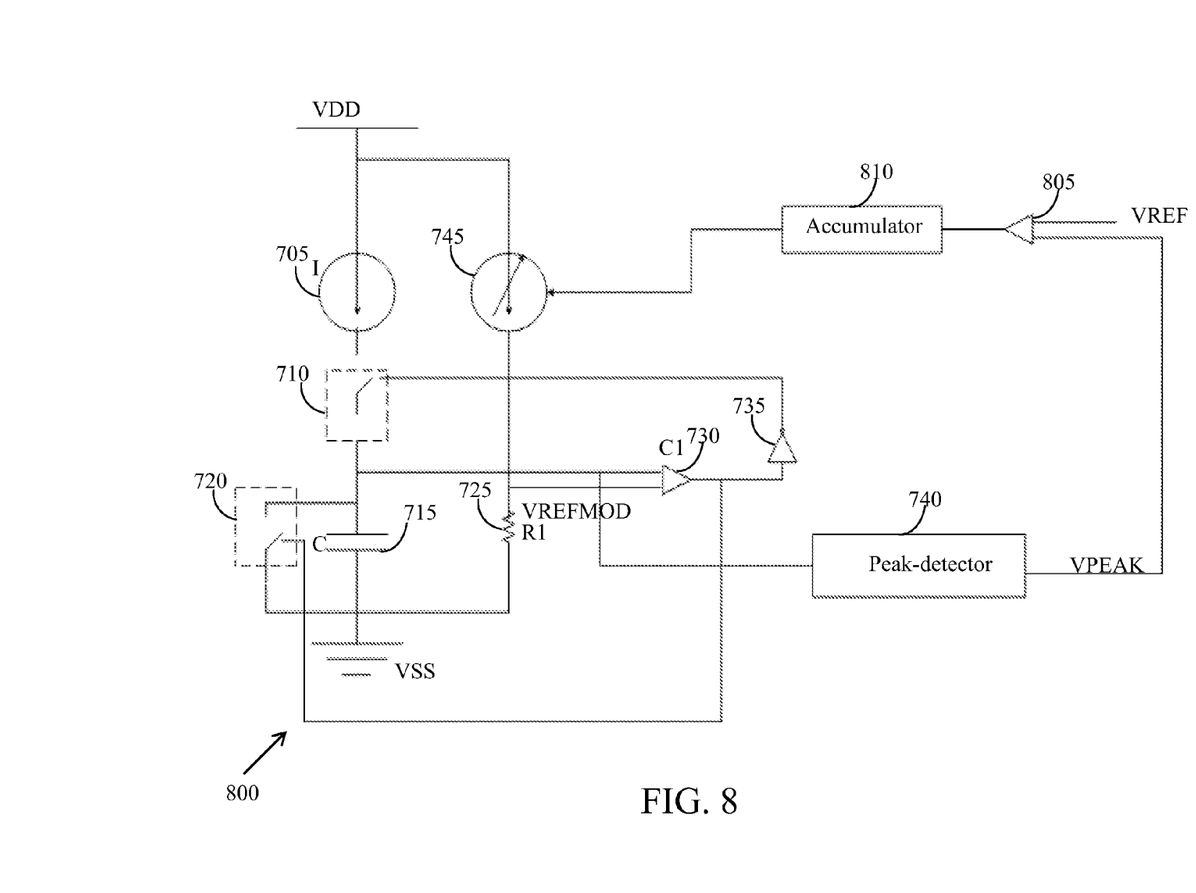
FIG. 8 is a block diagram of a relaxation oscillator with a digital control loop, in accordance with another embodiment.

FIG. 8 is a block diagram of a relaxation oscillator 800, in accordance with another embodiment.

The relaxation oscillator 800 includes a current source 705, a switch 710, a capacitor 715, a switch 720, a resistor 725, a comparator 730, a logic gate 735, a peak detector 740, a current source 745, a comparator circuit 805, and an accumulator 810.

For the digital control loop, the comparator circuit 805 and the accumulator 810 replaces the integrator 765.

The current source 705 is coupled between a power supply (VDD) and a first terminal of the switch 710. The capacitor 715 is coupled between a second terminal of the switch 710 and a ground supply (VSS). The capacitor 715 is also coupled across the switch 720. The comparator 730 has a positive input coupled between the second terminal of the switch 710 and the capacitor 715, and a negative input coupled to a first terminal of the resistor 725. A second terminal of the resistor 725 is coupled to the capacitor 715. The logic gate 735, for example a NOT gate, is coupled between output of the comparator 730 and the first terminal of the switch 710. The output of the comparator 730 is also coupled to the switch 720. A first terminal of the peak detector 740 is coupled to the positive input of the comparator 730. The current source 745 is coupled to the negative input of the comparator 730. A negative input of the comparator circuit 805 is coupled to a second terminal of the peak detector 740. The accumulator 810 is coupled between output of the comparator circuit 805 and the current source 745.

Voltage at the capacitor 715 is compared with VREFMOD that is generated by the current source 745 and can further be adjusted using the resistor 725 in a feedback loop. The comparator 730 compares the voltage with VREFMOD that is adjusted, and provides an output to the logic gate 735 and to the switch 720. The switch 720 controls discharge of the capacitor 715 based on the output of the comparator 730. The output of the comparator 730 is inverted by the logic gate 735 and further provided to the switch 710. The voltage at the capacitor 715 is provided to the peak detector 740. The peak detector 740 provides VPEAK. VPEAK is then compared with VREF by using the comparator circuit 805. The output of the comparator circuit 805 drives the accumulator 810. Output of the accumulator 810 changes the current through the current source 745 and hence generates VREFMOD. The current source is also a current digital-to-analog converter (DAC).

Figure 9:
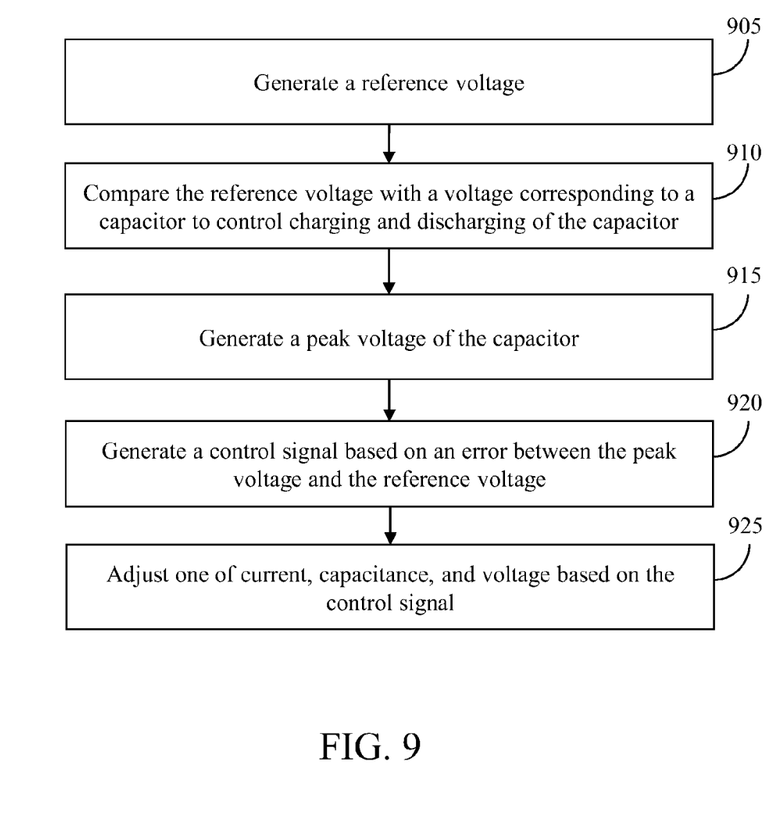
FIG. 9 is a flow diagram illustrating a method of reducing effect of comparator delay on oscillation frequency in a relaxation oscillator circuit, in accordance with one embodiment.

FIG. 9 is a flow diagram illustrating a method for reducing effect of comparator delay on oscillation frequency in a relaxation oscillator circuit, for example the relaxation oscillator 200, in accordance with one embodiment. The relaxation oscillator circuit can be implemented in one of an analog control loop and a digital control loop.

At step 905, a reference voltage is generated. A current source, for example the current source 260, generates a current which is a charging current. The current along with resistance of a resistor, for example the resistor 250, generates the reference voltage (VREF).

At step 910, the reference voltage is compared with a voltage corresponding to a capacitor, for example the capacitor 215, to control charging and discharging of the capacitor. The comparison can be performed using a comparator, for example the comparator 230. The current from the current source charges and discharges the capacitor.

The charging of the capacitor can be controlled using a switch, for example the switch 210.

At step 915, a peak voltage of the capacitor is generated. The peak voltage (VPEAK) can be generated by a peak detector, for example the peak detector 240.

At step 920, a control signal is generated based on an error between the peak voltage and the reference voltage. The error is determined using an error detector, for example the error detector 245 and the control signal can be generated using a controller, for example the controller 255.

At step 925, one of current, capacitance, and voltage is adjusted based on the control signal.

A relaxation oscillator enables oscillation frequency to be dependent only on resistance and capacitance values of the relaxation oscillator. The oscillation frequency of the relaxation oscillator is independent of a comparator delay. The relaxation oscillator is hence accurate at high frequencies across different voltage and temperature values. Output of the relaxation oscillator can also be obtained directly without using a phase-locked loop or a delay-locked loop to increase the oscillation frequency. Further, the relaxation oscillator is of a high precision and high frequency.

In the foregoing discussion, the term "coupled or connected" refers to either a direct electrical connection or mechanical connection between the devices connected or an indirect connection through intermediary devices. The term "circuit" means at least either a single component or a multiplicity of components, either active or passive, that are connected together to provide a desired function.

The foregoing description sets forth numerous specific details to convey a thorough understanding of embodiments of the disclosure. However, it will be apparent to one skilled in the art that embodiments of the disclosure may be practiced without these specific details. Some well-known features are not described in detail in order to avoid obscuring the disclosure. Other variations and embodiments are possible in light of above teachings, and it is thus intended that the scope of disclosure not be limited by this Detailed Description, but only by the Claims.

We claim:

1. A relaxation oscillator circuit with reduced sensitivity of oscillation frequency to comparator delay variation, the relaxation oscillator circuit comprising:
   a first current source that generates a charging current;
   a second current source coupled to the first current source to generate a reference voltage;
      a resistor coupled to the second current source to enable generation of the reference voltage;
      a capacitor, coupled to the first current source, that is charged based on the charging current;
      a comparator that is responsive to a voltage corresponding to the capacitor and the reference voltage to generate an output voltage;
      a peak detector coupled to the capacitor to generate a peak voltage;
      an error detector coupled to the peak detector and the second current source to generate an error based on the peak voltage and the reference voltage; and
      a controller coupled to the error detector to control one of the charging current, an offset voltage input to the comparator, and a capacitance of the capacitor.

2. The relaxation oscillator circuit as claimed in claim 1 and further comprising:
   a first switch, coupled between the first current source and the capacitor, that controls charging of the capacitor; and
   a second switch, coupled across the capacitor, that controls discharge of the capacitor based on output of the comparator.

3. The relaxation oscillator circuit as claimed in claim 2 and further comprising:
   an offset voltage source, coupled to the input of the comparator, to generate the offset voltage; and
   a logic gate, coupled between the first switch and the output of the comparator, that inverts the output voltage.

4. A relaxation oscillator circuit with reduced sensitivity of oscillation frequency to comparator delay variation, the relaxation oscillator circuit comprising:
   a first current source that generates a charging current;
   a second current source coupled to the first current source to generate a reference voltage;
   a resistor coupled to the second current source to enable generation of the reference voltage;
   a capacitor, coupled to the first current source, that is charged based on the charging current;
   a comparator that is responsive to a voltage corresponding to the capacitor and the reference voltage to generate an output voltage;
   a peak detector, coupled to the capacitor, to generate a peak voltage;
   a divide by two circuit, coupled to the comparator, to divide an output of the comparator by two;
   a switched capacitor amplifier that amplifies the reference voltage by a ratio of capacitance values to provide a voltage;
   a switched capacitor integrator, coupled to the switched capacitor amplifier, to integrate an error between the peak voltage and the reference voltage; and
   an inverting gain circuit, coupled between the capacitor and the switched capacitor integrator, that modifies capacitance of the capacitor.

5. The relaxation oscillator circuit as claimed in claim 4 and further comprising:
   a first switch, coupled between the first current source and the capacitor, that controls charging of the capacitor; and
   a second switch, coupled across the capacitor, that controls discharge of the capacitor based on the output of the comparator.

6. The relaxation oscillator circuit as claimed in claim 4, wherein the switched capacitor amplifier comprises an amplifier, one or more switches, and a plurality of capacitors.

7. The relaxation oscillator circuit as claimed in claim 4, wherein the switched capacitor integrator comprises an amplifier, one or more switches, and a plurality of capacitors.

8. The relaxation oscillator circuit as claimed in claim 4, wherein the divide by two circuit comprises a non-overlap clock generator that generates four non-overlapping phases to control one or more switches in the switched capacitor amplifier and the switched capacitor integrator.

9. The relaxation oscillator circuit as claimed in claim 4, wherein the inverting gain circuit comprises an amplifier and a plurality of resistors.

10. The relaxation oscillator circuit as claimed in claim 4, wherein the switched capacitor integrator and the inverting gain circuit are replaced with a comparator circuit and an accumulator for a digital control loop.

11. A relaxation oscillator circuit with reduced sensitivity of oscillation frequency to comparator delay variation, the relaxation oscillator circuit comprising:
- a first current source that generates a charging current;
- a second current source, coupled to the first current source, to generate a reference voltage;
- a capacitor, coupled to the first current source, that is charged based on the charging current;
- a comparator that is responsive to a voltage corresponding to the capacitor and the reference voltage to generate an output voltage;
- a peak detector, coupled to the capacitor, to generate a peak voltage;
- a resistor coupled to the peak detector to generate a current based on the peak voltage;
- an integrator, coupled to the resistor, to integrate an error between a current based on the peak voltage and the charging current of the capacitor; and
- an inverting gain circuit, coupled between the capacitor and the integrator, that modifies the charging current of the capacitor.

12. The relaxation oscillator circuit as claimed in claim 11 and further comprising:
- a first switch, coupled between the first current source and the capacitor, that controls charging of the capacitor; and
- a second switch, coupled across the capacitor, that controls discharge of the capacitor based on output of the comparator.

13. The relaxation oscillator circuit as claimed in claim 11, wherein the integrator comprises an amplifier and a capacitor.

14. The relaxation oscillator circuit as claimed in claim 11, wherein the inverting gain circuit comprises an amplifier and a plurality of resistors.

15. The relaxation oscillator circuit as claimed in claim 11, wherein the integrator and the inverting gain circuit are replaced with a comparator circuit and an accumulator for a digital control loop.

16. The relaxation oscillator circuit as claimed in claim 15, wherein the comparator circuit compares the peak voltage and a voltage corresponding to the charging current of the capacitor.

17. A relaxation oscillator circuit with reduced sensitivity of oscillation frequency to comparator delay variation, the relaxation oscillator circuit comprising:
- a first current source that generates a charging current;
- a second current source, coupled to the first current source, to generate a reference voltage;
- a resistor coupled to the second current source to enable generation of the reference voltage;
- a capacitor, coupled to the first current source, that is charged based on the charging current;
- a comparator that is responsive to a voltage corresponding to the capacitor and the reference voltage to generate an output voltage;
- a peak detector, coupled to the capacitor, to generate a peak voltage; and
- an integrator, coupled between the peak detector and the second current source, to control the second current source by integrating an error between the peak voltage and the reference voltage.

18. The relaxation oscillator circuit as claimed in claim 17 and further comprising:
- a first switch, coupled between the first current source and the capacitor, that controls charging of the capacitor; and
- a second switch, coupled across the capacitor, that controls discharge of the capacitor based on output of the comparator.

19. The relaxation oscillator circuit as claimed in claim 17, wherein the integrator comprises an amplifier, a resistor, and a capacitor.

20. The relaxation oscillator circuit as claimed in claim 17, wherein the integrator is replaced with a comparator circuit and an accumulator for a digital control loop.

\* \* \* \* \*